(12) United States Patent
Ito (10) Patent No.: US 11,600,510 B2
(45) Date of Patent: Mar. 7, 2023

(54) ELECTROSTATIC CHUCK HEATER

(71) Applicant: NGK INSULATORS, LTD., Nagoya (JP)

(72) Inventor: Joyo Ito, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 157 days.

(21) Appl. No.: 17/148,865

(22) Filed: Jan. 14, 2021

(65) Prior Publication Data
US 2021/0242064 A1    Aug. 5, 2021

(30) Foreign Application Priority Data

Feb. 4, 2020 (JP) .............................. JP2020-016729

(51) Int. Cl.
| | | |
|---|---|---|
| H01T 23/00 | (2006.01) | |
| H01L 21/683 | (2006.01) | |
| H01L 21/67 | (2006.01) | |
| H01J 37/32 | (2006.01) | |

(52) U.S. Cl.
CPC .... *H01L 21/6833* (2013.01); *H01J 37/32724* (2013.01); *H01L 21/67103* (2013.01); *H01J 2237/2007* (2013.01); *H01L 21/67069* (2013.01)

(58) Field of Classification Search
None
See application file for complete search history.

(56) References Cited

U.S. PATENT DOCUMENTS

| | | |
|---|---|---|
| 2005/0207088 A1 | 9/2005 | Nishimoto et al. |
| 2005/0217799 A1 | 10/2005 | O'Meara et al. |
| 2007/0258186 A1* | 11/2007 | Matyushkin ........ H01L 21/6875 361/234 |

FOREIGN PATENT DOCUMENTS

| | | |
|---|---|---|
| JP | 2002-217180 A | 8/2002 |
| JP | 2007-537582 A | 12/2007 |
| JP | 2010-135851 A1 | 6/2010 |
| JP | 2019-110312 A | 7/2019 |

OTHER PUBLICATIONS

Japanese Office Action (with English translation), Japanese Application No. 2020-016729, dated October 18, 2022 (9 pages).

* cited by examiner

*Primary Examiner* — Stephen W Jackson
(74) *Attorney, Agent, or Firm* — Burr Patent Law, PLLC (57) ABSTRACT

An electrostatic chuck heater includes a ceramic plate, an electrostatic electrode, first and second zone heater electrodes, and first and second zone gas grooves. The ceramic plate includes, on its surface, a wafer placement surface. The electrostatic electrode is embedded in the ceramic plate. The first and second zone heater electrodes are embedded in the ceramic plate, corresponding to respective multiple heater zones into which the wafer placement surface is divided, and allow electric power to be individually supplied to the heater zones. Zone gas grooves are provided corresponding to respective multiple gas supply zones into which the wafer placement surface is divided independently of the heater zones, and allow a gas to be individually supplied to the gas supply zones.

5 Claims, 9 Drawing Sheets

ELECTROSTATIC CHUCK HEATER

BACKGROUND OF THE INVENTION

1. Field of the Invention

The present invention relates to an electrostatic chuck heater.

2. Description of the Related Art

An electrostatic chuck heater attracts a wafer placed on a wafer placement surface by utilizing an electrostatic force, and is used in a semiconductor manufacturing device. For instance, as described in PTL 1, such an electrostatic chuck is known, which has first and second annular projections configured to come into contact with a wafer, on the outer circumferential edge of the wafer placement surface and on the inside of the outer circumferential edge, and has first and second gas groove areas between the first and second annular projections and on the inside of the second annular projection. When a wafer is placed on the wafer placement surface of the electrostatic chuck, the first and second gas groove areas each turn into a closed space by the wafer, and the pressure of heat conducting gas to be supplied to each closed space can be individually controlled.

CITATION LIST

Patent Literature

[PTL 1] JP 2010-135851 A

SUMMARY OF THE INVENTION

However, a heater is not incorporated in the electrostatic chuck in PTL 1. As a heater, zone heater electrodes corresponding to respective multiple heater zones may be incorporated in the electrostatic chuck. In such an electrostatic chuck, since the amount of heat generation can be controlled by adjusting the current for each zone heater electrode, the temperature can be adjusted for each heater zone. However, only with this effect, nonuniformity of the temperature of the wafer sometimes cannot be coped with.

The present invention has been devised to solve such a problem, and it is the main object to further improve the thermal uniformity of the wafer.

An electrostatic chuck heater according to the present invention includes:

a ceramic plate including, on a surface, a wafer placement surface;

an electrostatic electrode embedded in the ceramic plate;

zone heater electrodes which are embedded in the ceramic plate, corresponding to respective multiple heater zones into which the wafer placement surface is divided, and allow electric power to be individually supplied to the heater zones; and zone gas grooves which are provided corresponding to respective multiple gas supply zones into which the wafer placement surface is divided independently of the heater zones, and allow a gas to be individually supplied to the gas supply zones.

The electrostatic chuck heater includes multiple zone heater electrodes, and multiple zone gas grooves. When a wafer is placed on the wafer placement surface, each zone gas groove forms a closed space with the wafer. Thus, a gas can be supplied individually for each closed space. For instance, when a hot spot occurs in the wafer, let the heat of the hot spot escape efficiently to the ceramic plate by increasing the pressure of the gas to be supplied to a zone gas groove corresponding to the hot spot and/or supplying a gas with a high thermal conductivity coefficient to the hot spot. When a cool spot occurs in the wafer, escape of the heat of the cool spot to the ceramic plate is made difficult by decreasing the pressure of the gas to be supplied to a zone gas groove corresponding to the cool spot and/or supplying a gas with a low thermal conductivity coefficient to the cool spot. In the electrostatic chuck heater, temperature adjustment for each heater zone is possible by adjusting the electric power supplied to each zone heater electrode, and temperature adjustment for each zone gas groove is possible by adjusting the thermal conductivity of the gas for each zone gas groove. Therefore, the thermal uniformity of the wafer can be further improved.

In the electrostatic chuck heater of the present invention, one zone heater electrode may correspond to one or more zone gas grooves. In this manner, when the thermal uniformity of a portion of the wafer placed on the wafer placement surface is not good, the portion corresponding to a certain zone heater electrode, the thermal uniformity is improved by adjusting the thermal conductivity of the gas to be supplied to the zone gas groove corresponding to the zone heater electrode.

In the electrostatic chuck heater of the present invention, the zone gas groove may be provided at a section where the zone heater electrode is not provided. When the thermal uniformity of a portion of the wafer placed on the wafer placement surface is not good, the portion corresponding to an area (an area with no heater) where no zone heater electrode is provided, it is possible to adjust heat exchange from the surroundings of the area with no heater to the area with no heater by adjusting the thermal conductivity of the gas to be supplied to a zone gas groove corresponding to the area with no heater. Therefore, the thermal uniformity is improved.

In the electrostatic chuck heater of the present invention, the zone gas groove corresponding to one of two adjacent zone heater electrodes may overlap with the other zone heater electrode. In this manner, a zone gas groove is also disposed in the space between the two adjacent zone heater electrodes. Therefore, the thermal uniformity of a portion of the wafer placed on the wafer placement surface can be improved by adjusting the thermal conductivity of the gas to be supplied to the zone gas groove, the portion corresponding to the space between the two adjacent zone heater electrodes.

In the electrostatic chuck heater of the present invention, the zone gas groove may individually have a temperature measurement unit. In this manner, the thermal conductivity of the gas to be supplied to each zone gas groove can be adjusted so that the temperature of the zone gas groove achieves a target temperature.

DETAILED DESCRIPTION OF THE INVENTION

Figure 1:
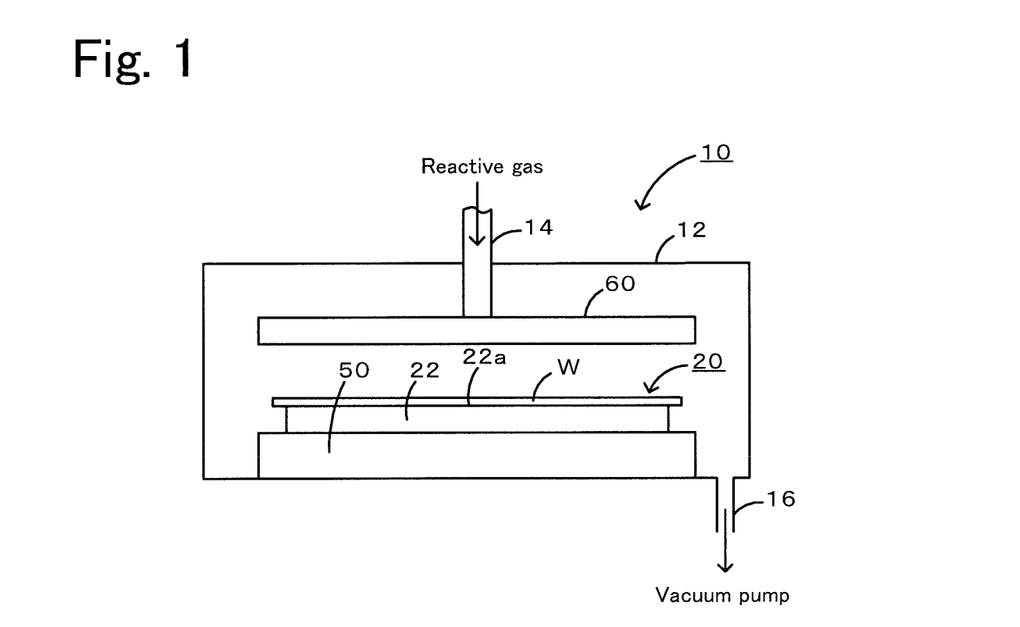
FIG. 1 is an explanatory drawing showing a schematic view of the structure of a plasma processing device 10.
Figure 2:
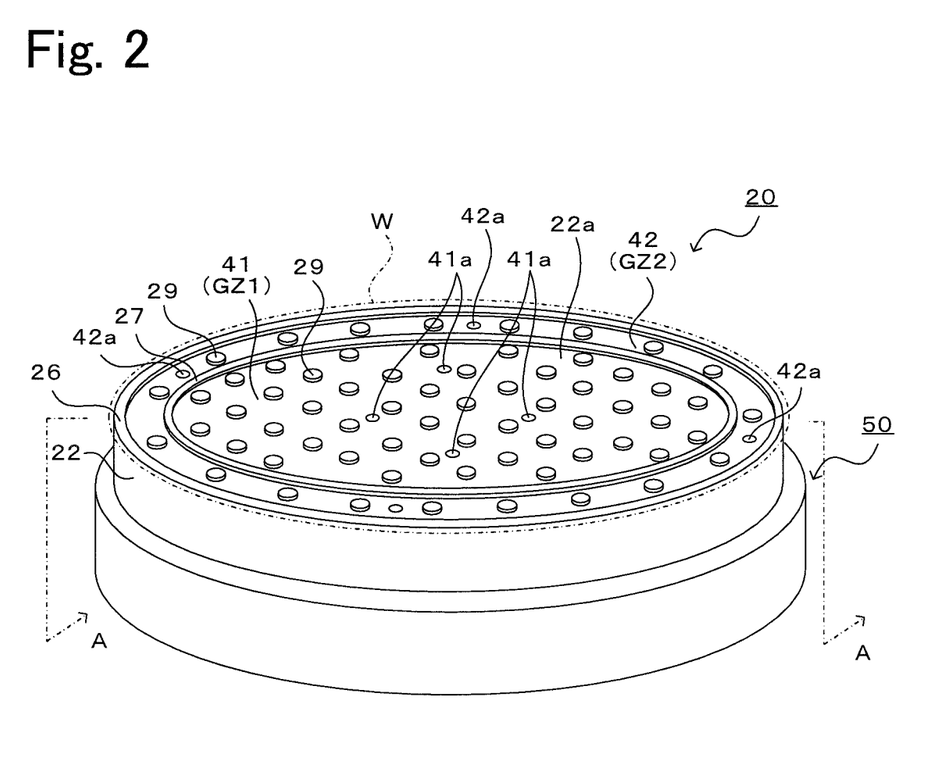
FIG. 2 is a perspective view of an electrostatic chuck heater 20 integrated with a cooling plate 30.
Figure 3:
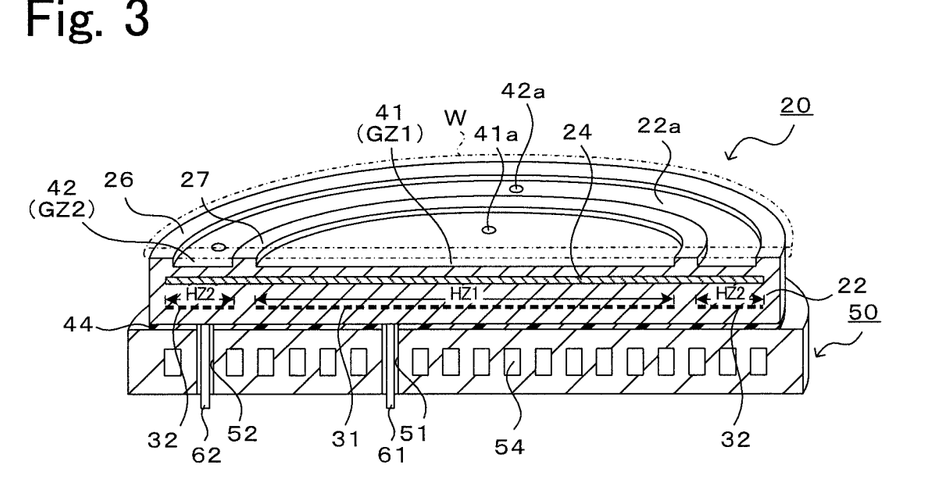
FIG. 3 is a cross-sectional view of FIG. 2 taken along A-A.
Figure 4:
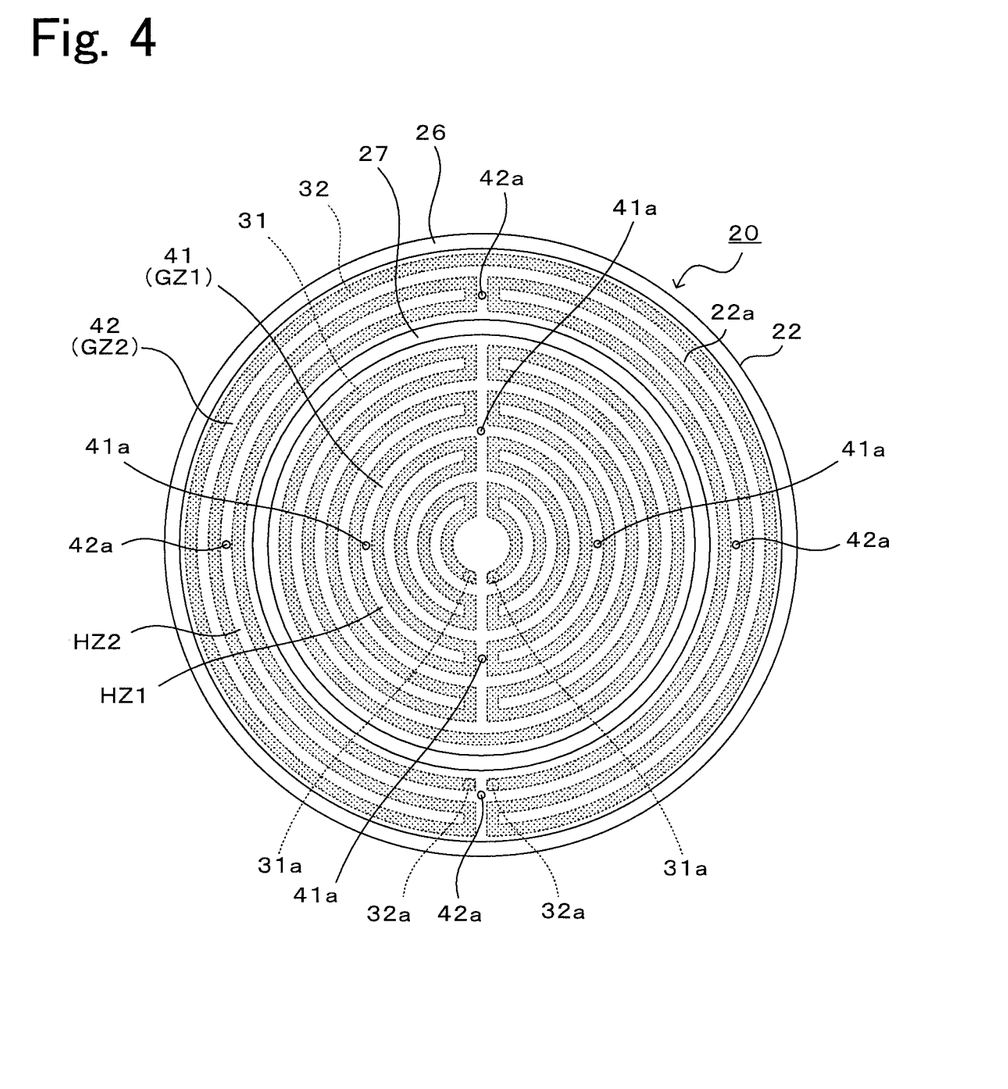
FIG. 4 is a plan view of the electrostatic chuck heater 20.

Next, an electrostatic chuck heater 20, which is a preferred embodiment of a ceramic heater of the present invention, will be described below. FIG. 1 is an explanatory drawing showing a schematic view of the structure of a plasma processing device 10 including the electrostatic chuck heater 20, FIG. 2 is a perspective view of the electrostatic chuck heater 20 integrated with a cooling plate 30, FIG. 3 is a cross-sectional view of FIG. 2 taken along A-A, and FIG. 4 is a plan view of the electrostatic chuck heater 20. It is to be noted that in FIG. 4, first and second zone heater electrodes 31, 32 are shown by hatching for the sake of convenience. In addition, in FIG. 3 and FIG. 4, tiny circular projections 29 on a wafer placement surface 22a have been omitted.

In the plasma processing device 10, as shown in FIG. 1, inside a vacuum chamber 12 made of metal (for instance, made of aluminum alloy), which can adjust an internal pressure, the electrostatic chuck heater 20 and an upper electrode 60 used when plasma is generated are installed. The electrostatic chuck heater 20 with bonded to the upper surface of a cooling plate 50 is installed inside the vacuum chamber 12. On the surface, opposed to the electrostatic chuck heater 20, of the upper electrode 60, a great number of small holes are opened for supplying a reactive gas to the wafer surface. The vacuum chamber 12 can introduce a reactive gas from a reactive gas introduction path 14 to the upper electrode 60, and as well can reduce the inner pressure of the vacuum chamber 12 to a predetermined degree of vacuum by a vacuum pump connected to an exhaust gas path 16.

As shown in FIG. 2, the electrostatic chuck heater 20 has a ceramic plate 22. The ceramic plate 22 is a disc-shaped plate made of ceramic (for instance, made of aluminum or made of aluminum nitride) having an outer diameter less than the outer diameter of a wafer W, and includes, on its surface, a wafer placement surface 22a capable of attracting and holding the wafer W. As shown in FIG. 3 and FIG. 4, an electrostatic electrode 24, a first zone heater electrode 31 and a second zone heater electrode 32 are embedded in the ceramic plate 22.

The electrostatic electrode 24 is a planar electrode capable of applying a DC voltage by an ESC power supply which is not illustrated, and is provided parallel to the wafer placement surface 22a. When a voltage is applied to the electrostatic electrode 24, the wafer W is attracted and held by the wafer placement surface 22a by Coulomb's force or Johnsen-Rahbek force. When application of a DC voltage is released, attracting and holding of the wafer W by the wafer placement surface 22a is released.

The first zone heater electrode 31 is a resistance heating element formed in a one-stroke pattern on a circular area (a first heater zone HZ1) having a diameter smaller than that of the ceramic plate 22. When the voltage of the heater power supply, which is not illustrated, is applied to ends 31a, 31a provided on both ends of the first zone heater electrode 31, the first zone heater electrode 31 is heated to heat the first heater zone HZ1.

The second zone heater electrode 32 is a resistance heating element formed in a one-stroke pattern on an annular area (a second heater zone HZ2) which surrounds the first heater zone HZ1. When the voltage of the heater power supply, which is not illustrated, is applied to ends 32a, 32a provided on both ends of the second zone heater electrode 32, the second zone heater electrode 32 is heated to heat the second heater zone HZ2.

The first and second zone heater electrodes 31, 32 are provided corresponding to the respective first and second heater zones HZ1, HZ2 which are obtained by dividing the wafer placement surface 22a into halves on the same plane parallel to the wafer placement surface 22a. The zone heater electrodes 31, 32 are comprised of a conductive material containing W, WC, Mo, or the like, for instance. The shapes of the zone heater electrodes 31, 32 are not particularly limited, and may be, for instance, a coil shape or a ribbon shape. Also, each zone heater electrode may be obtained by printing conductive material paste. A voltage can be applied from the heater power supply to the zone heater electrodes 31, 32 individually by a power feeding member which is not illustrated, inserted from the rear surface of the cooling plate 50.

The wafer placement surface 22a of the ceramic plate 22 is provided with an annular outer circumferential projection 26 disposed along the outer circumference of the ceramic plate 22, and an annular inner circumferential projection 27 disposed inwardly of the outer circumferential projection 26 spaced from the outer circumferential projection 26. The outer circumferential projection 26 and the inner circumferential projection 27 are provided so as to be concentric with the ceramic plate 22. Here, the gas groove provided corresponding to a circular area (first gas supply zone GZ1) surrounded by the inner circumferential projection 27 of the wafer placement surface 22a is referred to as a first zone gas groove 41, and the gas groove provided corresponding to an annular area (second gas supply zone GZ2) inside the outer circumferential projection 26 and outside the inner circumferential projection 27 is referred to as a second zone gas groove 42. In the present embodiment, the first gas supply zone GZ1 matches the first heater zone HZ1, and the second gas supply zone GZ2 matches the second heater zone HZ2. The first and second zone gas grooves 41, 42 one-to-one correspond to the first and second zone heater electrodes 31, 32, respectively. On the bottom surfaces of the first and second zone gas grooves 41, 42, a great number of tiny projections 29 with a height of several μm are formed as shown in FIG. 2. The height of the outer circumferential projection 26 and the inner circumferential projection 27 is the same as the height of the circular projections 29. Thus, the wafer W placed on the wafer placement surface 22a is supported by the upper surfaces of the circular projections 29, the outer circumferential projection 26 and the inner circumferential projection 27. A through hole 41a penetrating the ceramic plate 22 in a vertical direction is provided at several sections of the plane surface, not provided with the circular projections 29, of the first zone gas groove 41. In addition, a through hole 42a penetrating the ceramic plate 22 in a vertical direction is also provided in several sections of the plane surface, not provided with the circular projections 29, of the second zone gas groove 42. A noble gas adjusted to an arbitrary pressure is designed to be introduced from the outside of the plasma processing device 10 into each of the through holes 41a, 42a individually by a gas piping member which is not illustrated, inserted from the rear surface of the cooling plate 50.

The cooling plate 50 is a circular plate made of metal (for instance, made of aluminum or made of aluminum alloy), and is bonded to the lower surface of the ceramic plate 22 by an adhesive agent 44 as shown in FIG. 3. The cooling plate 50 has a coolant flow path 54 through which a coolant (cooling water) is circulated, the coolant being cooled by an external cooling device which is not illustrated. The cooling plate 50 includes vertically penetrating first and second sensor holes 51, 52 respectively at positions corresponding to the first and second zone gas grooves 41, 42. A first temperature measurement sensor 61 is disposed in the first sensor hole 51, and a second temperature measurement sensor 62 is disposed in the second sensor hole 52. The first and second temperature measurement sensors 61, 62 are not particularly limited as long as they can measure a temperature, and include, for instance, a contact thermometer (such as a thermocouple) and a non-contact thermometer (such as an IR sensor).

Next, an example of use of thus configured plasma processing device 10 will be described. First, with the electrostatic chuck heater 20 installed in the vacuum chamber 12, the wafer W is placed on the wafer placement surface 22a of the ceramic plate 22. The pressure in the vacuum chamber 12 is reduced and adjusted to a predetermined degree of vacuum by a vacuum pump, a DC voltage is applied to the electrostatic electrode 24 of the ceramic plate 22 to generate Coulomb's force or Johnsen-Rahbek force, and the wafer W is attracted and held by the wafer placement surface 22a of the ceramic plate 22. Consequently, the first and second zone gas grooves 41, 42 form closed spaces together with the wafer W. A He gas with a high thermal conductivity coefficient is introduced to each closed space so as to achieve a predetermined sealing pressure. Next, a reactive gas atmosphere with a predetermined pressure (for instance, several 10 to several 100 Pa) is created in the vacuum chamber 12, and in this state, a high-frequency voltage is applied across the upper electrode 60 in the vacuum chamber 12 and the electrostatic electrode 24 of the ceramic plate 22 to generate a plasma. Although both a DC voltage and a high-frequency voltage for generating an electrostatic force are assumed to be applied to the electrostatic electrode 24, the high-frequency voltage may be applied to the cooling plate 50 instead of the electrostatic electrode 24. The surface of the wafer W is then etched by the generated plasma. When etching is performed, a target temperature T of the wafer W is set in advance. An operator adjusts the electric power to be supplied to the first zone heater electrode 31, and adjusts the type and the sealing pressure of the gas to be supplied to the first zone gas groove 41 so that the output value of the first temperature measurement sensor 61 matches the target temperature. The operator adjusts the electric power to be supplied to the second zone heater electrode 32 and adjusts the type and the sealing pressure of the gas to be supplied to the second zone gas groove 42 so that the output value of the second temperature measurement sensor 62 matches the target temperature. The work performed by the operator may be executed by a computer.

When a hot spot occurs in the wafer W, let the heat of the hot spot escape efficiently to the ceramic plate 22 by increasing the sealing pressure of the gas to be supplied to a zone gas groove corresponding to the hot spot and/or supplying a gas (for instance, He gas) with a high thermal conductivity coefficient to the hot spot. Alternatively, the electric power to be supplied to the zone heater electrode of a heater zone corresponding to the hot spot is reduced to control the amount of heat generation. On the other hand, when a cool spot occurs in the wafer W, escape of the heat of the cool spot to the ceramic plate 22 is made difficult by decreasing the pressure of the gas to be supplied to a zone gas groove corresponding to the cool spot and/or supplying a gas (for instance, Ar gas) with a low thermal conductivity coefficient to the cool spot. Alternatively, the electric power to be supplied to the zone heater electrode of a heater zone corresponding to the cool spot is enhanced to increase the amount of heat generation.

In the electrostatic chuck heater described above in detail, it is possible to adjust the temperature of each of the first and second heater zones HZ1, HZ2 by adjusting the electric power to be supplied to each of the first and second zone heater electrodes 31, 32, and also it is possible to adjust the temperature of each of the first and second zone gas grooves 41, 42 by adjusting the thermal conductivity of each of the first and second zone gas grooves 41, 42. Therefore, the thermal uniformity of the wafer W can be further improved.

Also, one zone gas groove corresponds to one zone heater electrode. In other words, when the electrostatic chuck heater 20 is seen in a plan view, the first zone gas groove 41 overlaps with the first zone heater electrode 31, and the second zone gas groove 42 overlaps with the second zone heater electrode 32. Thus, when the thermal uniformity of a portion of the wafer W placed on the wafer placement surface 22a is not good, the portion corresponding to a certain zone heater electrode, the thermal uniformity is improved by adjusting the thermal conductivity of the gas to be supplied to the zone gas groove corresponding to the zone heater electrode.

In addition, the first and second zone gas grooves 41, 42 individually have the first and second temperature measurement sensors 61, 62. Thus, the thermal conductivity of the gas to be supplied to each of the first and second zone gas grooves 41, 42 can be adjusted so that the temperature of each of the first and second zone gas grooves 41, 42 achieves a target temperature.

It is to be noted that needless to say the present invention is not particularly limited to the embodiment described above at all, and may be implemented in various aspects as long as within the technical scopes of the present invention.

Figure 5:
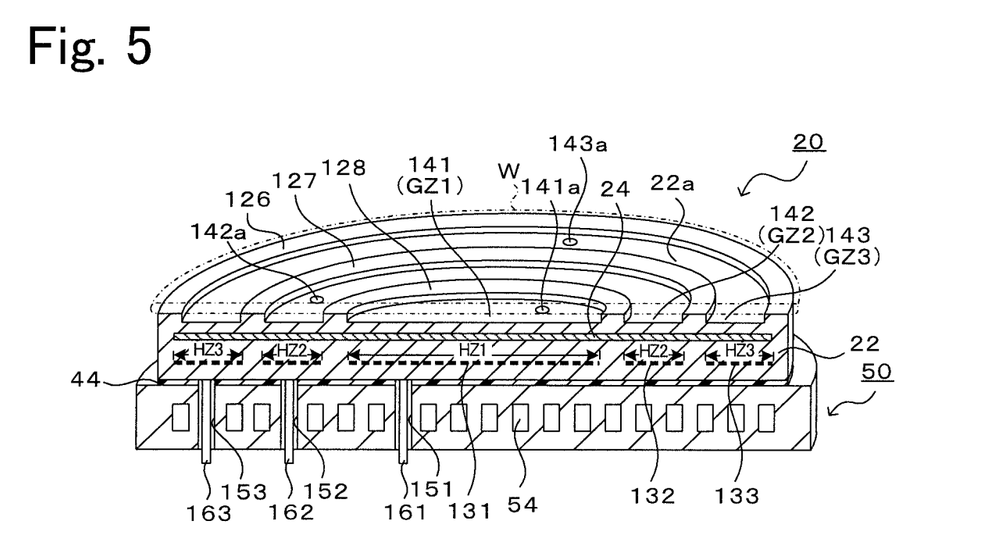
FIG. 5 is a cross-sectional view of another example of the electrostatic chuck heater 20.

For instance, in the embodiment described above, each of the two zone heater electrodes corresponds to one zone gas groove, however, without being limited to this, each of three or more zone heater electrodes may correspond to one zone gas groove. For instance, as shown in FIG. 5, first to third zone heater electrodes 131, 132, 133 may correspond to first to third zone gas grooves 141, 142, 143, respectively. Here, an annular outer circumferential projection 126 is provided on the outermost circumference of the wafer placement surface 22a, an annular intermediate projection 127 is provided inwardly of the outermost circumference, and an annular inner circumferential projection 128 is provided further inwardly of the outermost circumference. The first zone gas groove 141 is inward of the inner circumferential projection 128, the second zone gas groove 142 is between the inner circumferential projection 128 and the intermediate projection 127, and the third zone gas groove 143 is between the intermediate projection 127 and the outer circumferential projection 126. The first to third zone gas grooves 141, 142, 143 match first to third gas supply zones GZ1, GZ2, GZ3, respectively, and are individually supplied with a gas through first to third through holes 141a, 142a, 143a, respectively. The temperature of each of the first to third gas supply zones GZ1, GZ2, GZ3 can be measured by a corresponding one of first to third temperature measurement sensors 161, 162, 163 respectively inserted in first to third sensor holes 151, 152, 153 of the cooling plate 50. The first to third zone heater electrodes 131, 132, 133 are provided in the first to third heater zones HZ1, HZ2, HZ3, respectively. The first heater zone HZ1 is a circular area that matches the first gas supply zone GZ1, the second heater zone HZ2 is an annular area that matches the second gas supply zone GZ2, and the third heater zone HZ3 is an annular area that matches the third gas supply zone GZ3. In FIG. 5, the same components as those in the embodiment described above are labeled with the same symbol. With the electrostatic chuck heater 20 of FIG. 5, the same effects as those of the embodiment described above are obtained.

Figure 6:
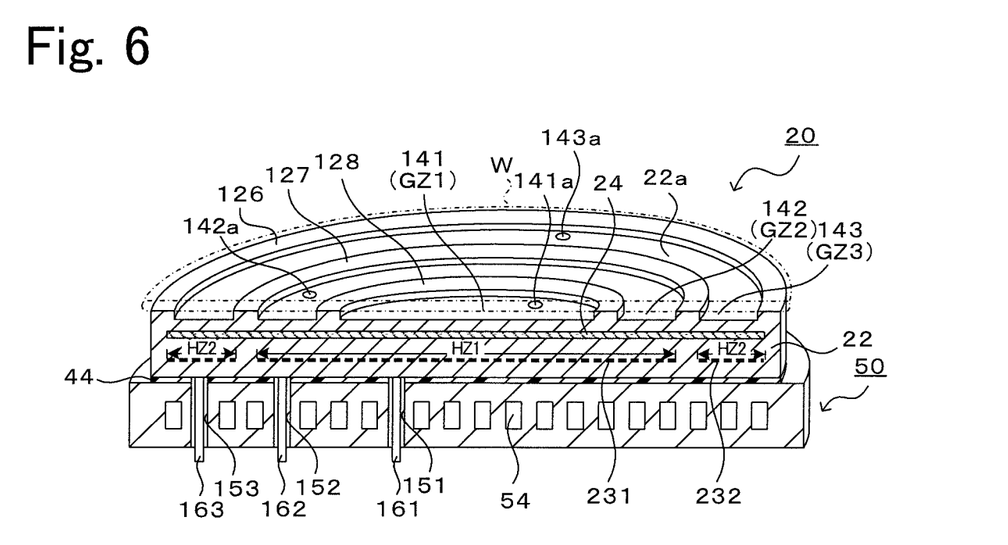
FIG. 6 is a cross-sectional view of another example of the electrostatic chuck heater 20.

Alternatively, one zone heater electrode may correspond to two or more zone gas grooves. In other words, when the electrostatic chuck heater 20 is seen in a plan view, one zone heater electrode may overlap with two or more zone gas grooves. For instance, the electrostatic chuck heater 20 of FIG. 6 basically has the same structure as that of FIG. 5, but differs from FIG. 5 in that a first zone heater electrode 231 is provided in the first heater zone HZ1 which is a circular area inward of the intermediate projection 127, a second zone heater electrode 232 is provided in the second heater zone HZ2 which is an annular area between the intermediate projection 127 and the outer circumferential projection 126, and the first zone heater electrode 231 corresponds to the first and second zone gas grooves 141, 142. In FIG. 6, since the first zone heater electrode 231 corresponds to the first and second zone gas grooves 141, 142, it is possible to adjust the temperature of the first heater zone HZ1 by the gas to be supplied individually to each of the first and second zone gas grooves 141, 142. It is to be noted that the second zone heater electrode 232 may correspond to two or more zone gas grooves.

Figure 7:
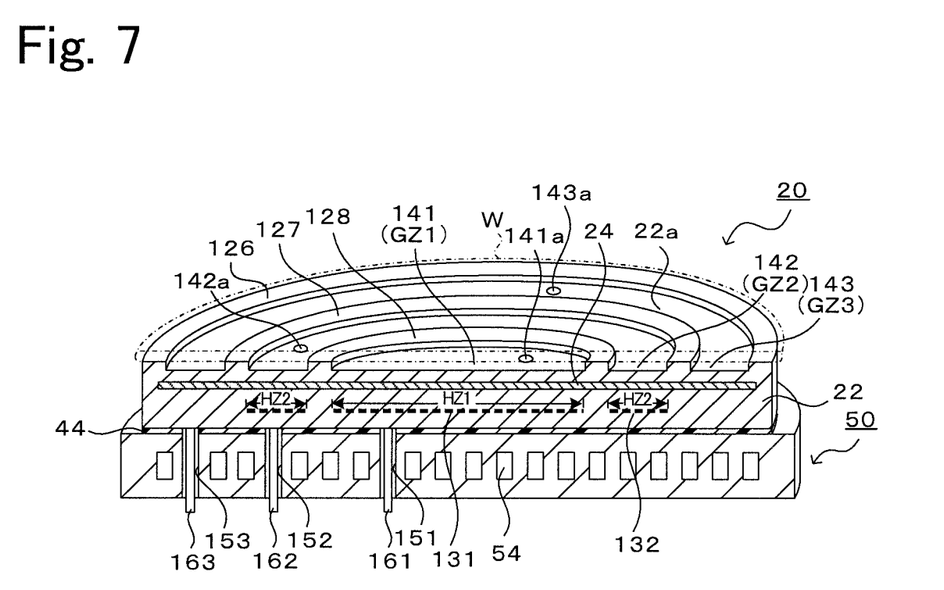
FIG. 7 is a cross-sectional view of another example of the electrostatic chuck heater 20.
Figure 8:
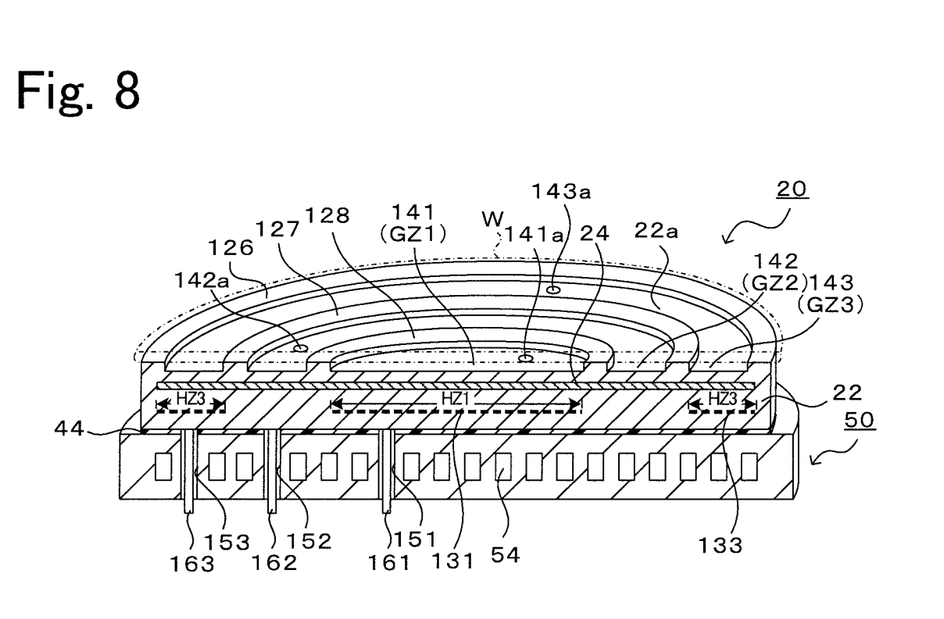
FIG. 8 is a cross-sectional view of another example of the electrostatic chuck heater 20.

In the embodiment described above, a zone heater electrode and a zone gas groove are provided one-to-one, however, a zone gas groove may also be provided at a section where no zone heater electrode is provided. In other words, when the electrostatic chuck heater 20 is seen in a plan view, a zone gas groove may be disposed in the space between two adjacent zone heater electrodes. For instance, the electrostatic chuck heater 20 of FIG. 7 basically has the same structure as that of FIG. 5, but differs from FIG. 5 in that the third zone heater electrode 133 is not provided. As a consequence, the third zone gas groove 143 is provided at a section where no zone heater electrode is provided. When the thermal uniformity of a portion of the wafer W placed on the wafer placement surface 22a is not good, the portion corresponding to an area (an annular area with no heater outwardly of the intermediate projection 127) where no zone heater electrode is provided, the thermal conductivity of the gas to be supplied to the third zone gas groove 143 is adjusted, which corresponds to the area with no heater. In this manner, it is possible to adjust heat exchange from the surroundings of the area with no heater to the area with no heater. Thus, the thermal conductivity is improved. In addition, the electrostatic chuck heater 20 of FIG. 8 basically has the same structure as that of FIG. 5, but differs from FIG. 5 in that the second zone heater electrode 132 is not provided. As a consequence, the second zone gas groove 142 is provided at a section where no zone heater electrode is provided. When the thermal uniformity of a portion of the wafer W placed on the wafer placement surface 22a is not good, the portion corresponding to an area (an annular area with no heater between the intermediate projection 127 and the inner circumferential projection 128) where no zone heater electrode is provided, the thermal conductivity of the gas to be supplied to the second zone gas groove 142 is adjusted, which corresponds to the area with no heater. In this manner, it is possible to adjust heat exchange from the surroundings of the area with no heater to the area with no heater. Thus, the thermal conductivity is improved.

Figure 9:
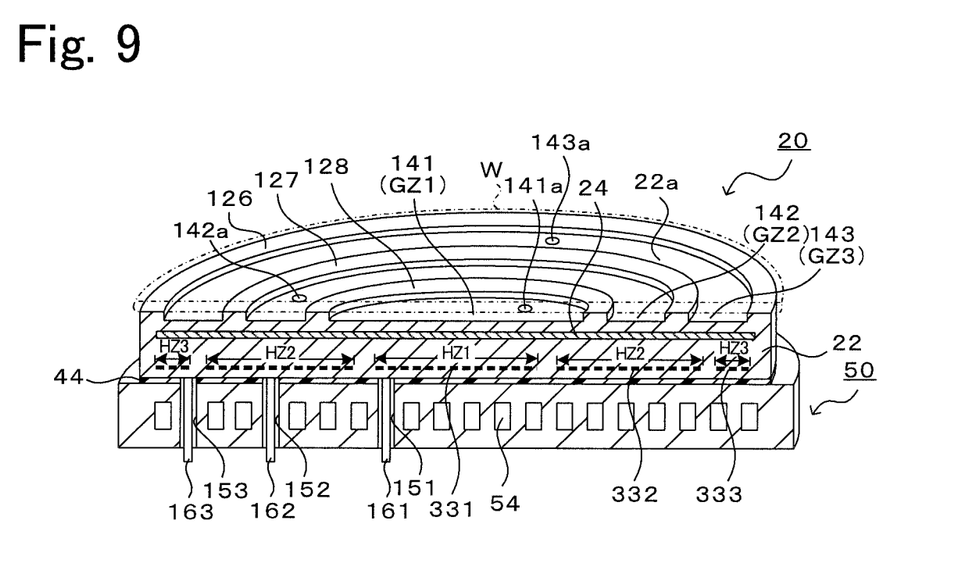
FIG. 9 is a cross-sectional view of another example of the electrostatic chuck heater 20.

Alternatively, a zone gas groove corresponding to one of the two adjacent zone heater electrodes may overlap with the other zone heater electrode. For instance, the electrostatic chuck heater 20 of FIG. 9 basically has the same structure as that of FIG. 5, but differs from FIG. 5 in the following points. That is, when the electrostatic chuck heater 20 of FIG. 9 is seen in a plan view, the first zone gas groove 141 overlaps with the first heater zone HZ1 where a first zone heater electrode 331 is provided, and also overlaps with the second heater zone HZ2 where a second zone heater electrode 332 is provided. In addition, the third zone gas groove 143 overlaps with the third heater zone HZ3 where a third zone heater electrode 333 is provided, and also overlaps with the second heater zone HZ2 where the second zone heater electrode 332 is provided. As a consequence, the first zone gas groove 141 is disposed in the space between the adjacent first and second zone heater electrodes 331, 332, and the third zone gas groove 143 is disposed in the space between the adjacent second and third zone heater electrodes 332, 332. Therefore, the thermal uniformity of a portion of the wafer W placed on the wafer placement surface 22a can be improved by adjusting the thermal conductivity of the gas to be supplied to the first zone gas groove 141, the portion corresponding to the space between the adjacent first and second zone heater electrodes 331, 332. In addition, the thermal uniformity of a portion of the wafer W placed on the wafer placement surface 22a can be improved by adjusting the thermal conductivity of the gas to be supplied to the third zone gas groove 143, the portion corresponding to the space between the adjacent second and third zone heater electrodes 332, 333.

Figure 10:
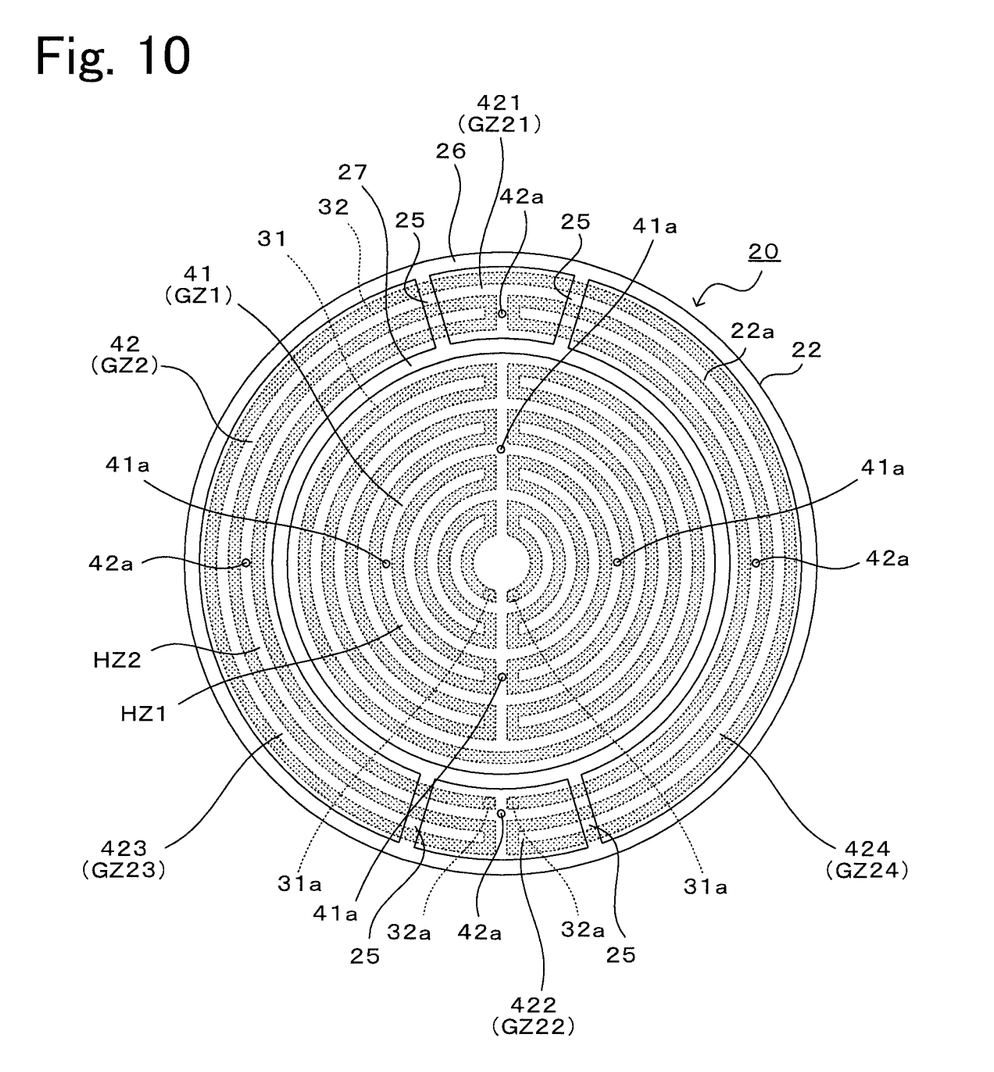
FIG. 10 is a plan view of another example of the electrostatic chuck heater 20.

In the embodiment described above, as shown in FIG. 10, the second zone gas groove 42 (the second gas supply zone GZ2) may be divided into four zones, that is, two small zone gas grooves 421, 422 (small zones GZ21, GZ22) and two large zone gas grooves 423, 424 (large zones GZ23, GZ24) by connecting between the outer circumferential projection 26 and the inner circumferential projection 27 with four cross-linking sections 25. It is to be noted that in FIG. 10, the same components as those in the embodiment described above are labeled with the same symbol. In FIG. 10, the second zone heater electrode 32 corresponds to four zone gas grooves 421 to 424. The small zone gas grooves 421, 422 include a fold-back section of the second zone heater electrode 32. Such a fold-back section tends to be a singular point of temperature, but the temperature difference from the surroundings can be reduced by adjusting the thermal conductivity of the gas to be supplied to the small zone gas grooves 421, 422. It is to be noted that a through hole to insert a lift pin for vertically moving the wafer placed on the wafer placement surface 22a tends to be a singular point of temperature, thus a small zone gas groove may be provided around the through hole.

In the embodiment described above, the first heater zone HZ1 which is a circular area may be divided into halves resulting in two semi-circular areas, each of which may be set as a heater zone, and a zone heater electrode corresponding to each heater zone may be provided. Alternatively, using multiple radii starting from the center of the circle of the first heater zone HZ1 with equally spaced angles, the first heater zone HZ1 may be divided into multiple sector areas, each of which may be set as a heater zone, and a zone heater electrode corresponding to each heater zone may be provided.

Figure 11:
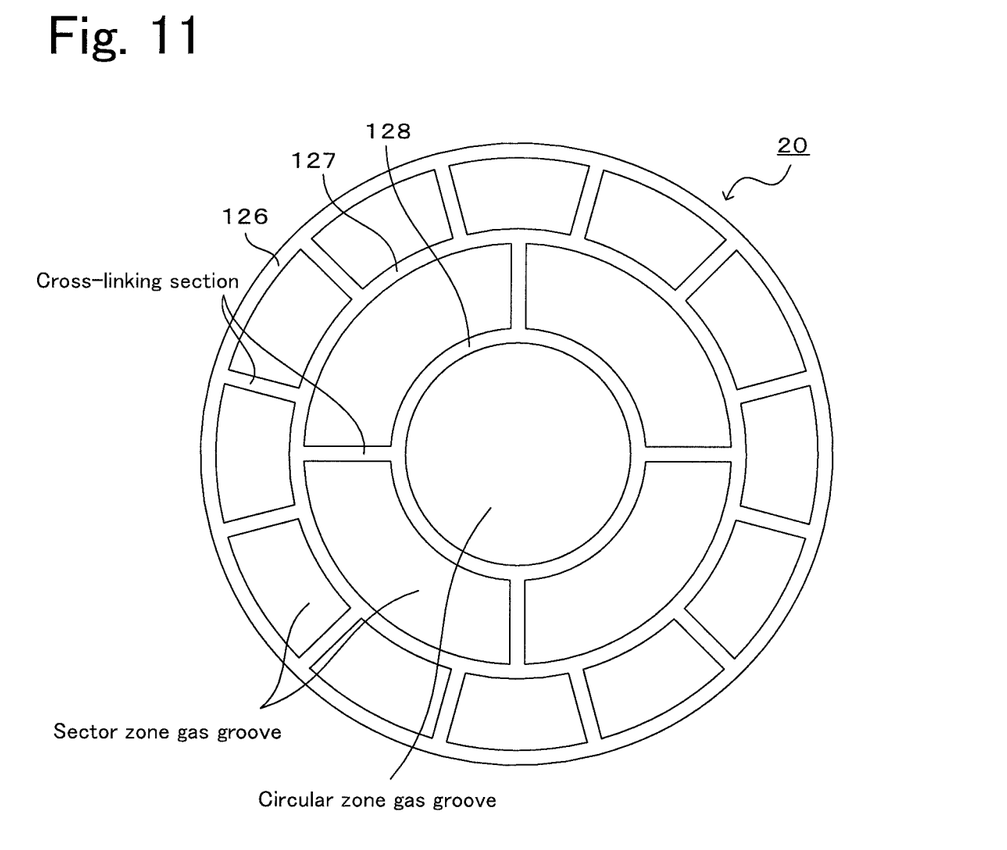
FIG. 11 is a plan view of another example of the electrostatic chuck heater 20.

In the embodiment described above, the zone gas groove (gas supply zone) may be a sector area. For instance, as shown in FIG. 11, the electrostatic chuck heater 20 may include: a circular zone gas groove (gas supply zone) inwardly of the inner circumferential projection 128; multiple (four herein) sector zone gas grooves (gas supply zones) into which the annular area between the inner circumferential projection 128 and the intermediate projection 127 is divided by the cross-linking sections; and multiple (12 herein) sector zone gas grooves (gas supply zones) into which the annular area between the intermediate projection 127 and the outer circumferential projection 126 is divided by the cross-linking sections. Each zone gas groove has at least one through hole for gas supply. In this case, a zone heater electrode may be provided corresponding to each of the zone gas grooves, or multiple zone gas grooves may be grouped and a zone heater electrode may be provided corresponding to each of the groups.

The application claims priority to Japanese Patent Application No. 2020-016729 filed in the Japan Patent Office on Feb. 4, 2020, the entire contents of which are incorporated herein by reference.

What is claimed is:

1. An electrostatic chuck heater comprising:
a ceramic plate including, on a surface, a wafer placement surface;
an electrostatic electrode embedded in the ceramic plate;
zone heater electrodes which are embedded in the ceramic plate, corresponding to respective multiple heater zones into which the wafer placement surface is divided, and allow electric power to be individually supplied to the heater zones; and
zone gas grooves which are provided corresponding to respective multiple gas supply zones into which the wafer placement surface is divided independently of the heater zones, and allow a gas to be individually supplied to the gas supply zones.

2. The electrostatic chuck heater according to claim 1, wherein each of the zone heater electrodes corresponds to one or more of the zone gas grooves.

3. The electrostatic chuck heater according to claim 1, wherein at least one of the zone gas grooves is also provided at a section where none of the zone heater electrodes is provided.

4. The electrostatic chuck heater according to claim 1, wherein the zone gas groove corresponding to one of adjacent two of the zone heater electrodes overlaps with the other zone heater electrode.

5. The electrostatic chuck heater according to claim 1, wherein the zone gas grooves individually have a temperature measurement unit.

* * * * *